(12) United States Patent
Choi et al.

(10) Patent No.: US 11,908,543 B2
(45) Date of Patent: Feb. 20, 2024

(54) LATCH CIRCUIT, TRANSMISSION CIRCUIT INCLUDING LATCH CIRCUIT, AND SEMICONDUCTOR APPARATUS INCLUDING TRANSMISSION CIRCUIT

(71) Applicant: SK hynix Inc., Icheon-si (KR)

(72) Inventors: Eun Ji Choi, Icheon-si (KR); Keun Seon Ahn, Icheon-si (KR); Kwan Su Shon, Icheon-si (KR); Yo Han Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 48 days.

(21) Appl. No.: 17/703,646

(22) Filed: Mar. 24, 2022

(65) Prior Publication Data

US 2023/0111807 A1 Apr. 13, 2023

(30) Foreign Application Priority Data

Oct. 7, 2021 (KR) .................... 10-2021-0133018

(51) Int. Cl.
*G11C 7/00* (2006.01)
*G11C 7/10* (2006.01)
*H03K 3/037* (2006.01)
*G11C 7/22* (2006.01)

(52) U.S. Cl.
CPC ............ *G11C 7/106* (2013.01); *G11C 7/1087* (2013.01); *G11C 7/222* (2013.01); *H03K 3/037* (2013.01)

(58) Field of Classification Search
CPC ...................................................... G11C 7/106
USPC .................................................. 365/189.05
See application file for complete search history.

(56) References Cited

U.S. PATENT DOCUMENTS 6,249,461 B1   6/2001  Choi et al.
2015/0207506 A1*  7/2015  Song .................. H03K 19/0185
                                                    327/333
2016/0080139 A1   3/2016  Song
2019/0385672 A1* 12/2019  Sinangil ................ G11C 11/418

* cited by examiner

*Primary Examiner* — Hoai V Ho
(74) *Attorney, Agent, or Firm* — William Park & Associates Ltd.

(57) ABSTRACT

The present technology may include a first detection unit configured to generate an output signal by detecting a level of an input terminal in response to a transition of a control clock signal during a normal read operation, and a second detection unit configured to generate the output signal by detecting the level of the input terminal regardless of the transition of the control clock signal during a state information read operation.

20 Claims, 8 Drawing Sheets

LATCH CIRCUIT, TRANSMISSION CIRCUIT INCLUDING LATCH CIRCUIT, AND SEMICONDUCTOR APPARATUS INCLUDING TRANSMISSION CIRCUIT

CROSS-REFERENCES TO RELATED APPLICATION

The present application claims priority under 35 U.S.C. § 119(a) to Korean application number 10-2021-0133018, filed on Oct. 7, 2021, in the Korean Intellectual Property Office, which is incorporated herein by reference in its entirety.

BACKGROUND

1. Technical Field

Various embodiments generally relate to a semiconductor circuit, and particularly, to a latch circuit, a transmission circuit including the latch circuit, and a semiconductor apparatus including the transmission circuit.

2. Related Art

A semiconductor apparatus, for example, a semiconductor memory apparatus may store externally provided data in a memory area and output the data stored in the memory area to the outside of the semiconductor memory apparatus. The semiconductor memory apparatus has the problem that as an operation speed increases, that is, as an operation frequency increases, the layout margin of a circuit configuration related to data output decreases and current consumption increases.

SUMMARY

A latch circuit in accordance with an embodiment of the present disclosure may include: a first detection unit configured to generate an output signal by detecting a level of an input terminal in response to a transition of a control clock signal during a normal read operation; and a second detection unit configured to generate the output signal by detecting the level of the input terminal regardless of the transition of the control clock signal during a state information read operation.

A latch circuit in accordance with an embodiment of the present disclosure may include: a cross-coupled latch configured to latch a level of an input terminal in response to a transition of a control clock signal and output latched data through an output terminal; and a switching section, connected between the output terminal and the input terminal, configured to output state information, which is input through the input terminal, through the output terminal in response to a state information read signal regardless of a transition of the control clock signal.

A transmission circuit in accordance with an embodiment of the present disclosure may include: a latch circuit configured to generate output signals by detecting levels of data, which are input through a plurality of differential input terminals, according to a transition of control clock signals during a normal read operation, and configured to generate the output signals by detecting a level of state information, which is input through the plurality of differential input terminals, regardless of the transition of the control clock signals during a state information read operation; and a serializer configured to serialize and output the output signals.

A semiconductor apparatus in accordance with an embodiment of the present disclosure may include: a memory cell array configured to store normal data; a control circuit configured to generate control signals including multi-phase clock signals in response to an external clock signal and configured to output internally stored state information in response to a state information read command; an input/output pad unit; and a transmission circuit configured to generate output signals by detecting levels of the normal data, which are input through a plurality of differential input terminals, according to a transition of control clock signals, and configured to generate the output signals by detecting a level of state information, which is input through the plurality of differential input terminals, regardless of the transition of the control clock signals and to output the output signals to an external device through the input/output pad unit during a state information read operation.

DETAILED DESCRIPTION

Hereinafter, embodiments of the present disclosure will be described in more detail with reference to the drawings.

Various embodiments are directed to providing a latch circuit, a transmission circuit including the latch circuit, and a semiconductor apparatus including the transmission circuit, by which it is possible to increase a layout margin and reduce current consumption.

Figure 1:
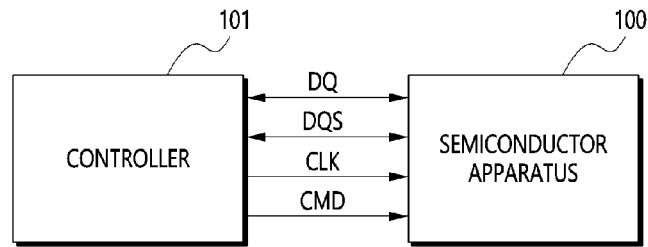
FIG. 1 is a diagram illustrating the configuration of a semiconductor system 10 in accordance with an embodiment of the present disclosure.

FIG. 1 is a diagram illustrating the configuration of a semiconductor system 10 in accordance with an embodiment of the present disclosure.

Referring to FIG. 1, the semiconductor system 10 in accordance with an embodiment of the present disclosure may include a semiconductor apparatus 100 and a controller 101. The semiconductor apparatus 100 may operate under the control of the controller 101. The semiconductor apparatus 100 may operate according to a command CMD that is provided from the controller 101. The command CMD may include a write command, a read command, and a state information read command. The semiconductor apparatus 100 may write data in a memory cell array in response to a write command that is provided from the controller 101. The semiconductor apparatus 100 may perform a read operation in response to a read command that is provided from the controller 101. When receiving a read command and an address from the controller 101, the semiconductor apparatus 100 may read data that corresponds to the address in the memory cell array and may output the read data to the controller 101. The semiconductor apparatus 100 may perform a state information read operation in response to a state information read command that is provided from the controller 101. When receiving a state information read command from the controller 101, the semiconductor apparatus 100 may read state information from a register (hereinafter, referred to as a state information register) that is provided separately from the memory cell array and may output the read state information to the controller 101.

The semiconductor apparatus 100 may include at least one of a NAND flash memory, a vertical NAND (hereinafter, referred to as a VNAND) flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), and the like. The semiconductor apparatus 100 of the present disclosure may be implemented in a three-dimensional array structure. The present disclosure may be applied not only to a flash memory device in which a charge storage layer is configured as a conductive floating gate, but also to a charge trap flash (CTF) in which a charge storage layer is configured as an insulating film.

The controller 101 may be connected between the semiconductor apparatus 100 and a host. The host may include a CPU, a GPU, or the like. The controller 101 may be configured to interface the host and the semiconductor apparatus 100. The controller 101 may transmit a write command and a read command to the semiconductor apparatus 100 under the control of the host.

Between the controller 101 and the semiconductor apparatus 100, signal lines for transmission of data DQ, a signal line for transmission of a data strobe signal DQS, and a signal line for transmission of an external clock signal (hereinafter, a clock signal) CLK may be connected. The data strobe signal DQS may be a bidirectional signal. During a data output operation of the semiconductor apparatus 100, the semiconductor apparatus 100 may provide the data strobe signal DQS to the controller 101. During a read operation of the semiconductor apparatus 100, the controller 101 may provide the data strobe signal DQS to the semiconductor apparatus 100.

Figure 2:
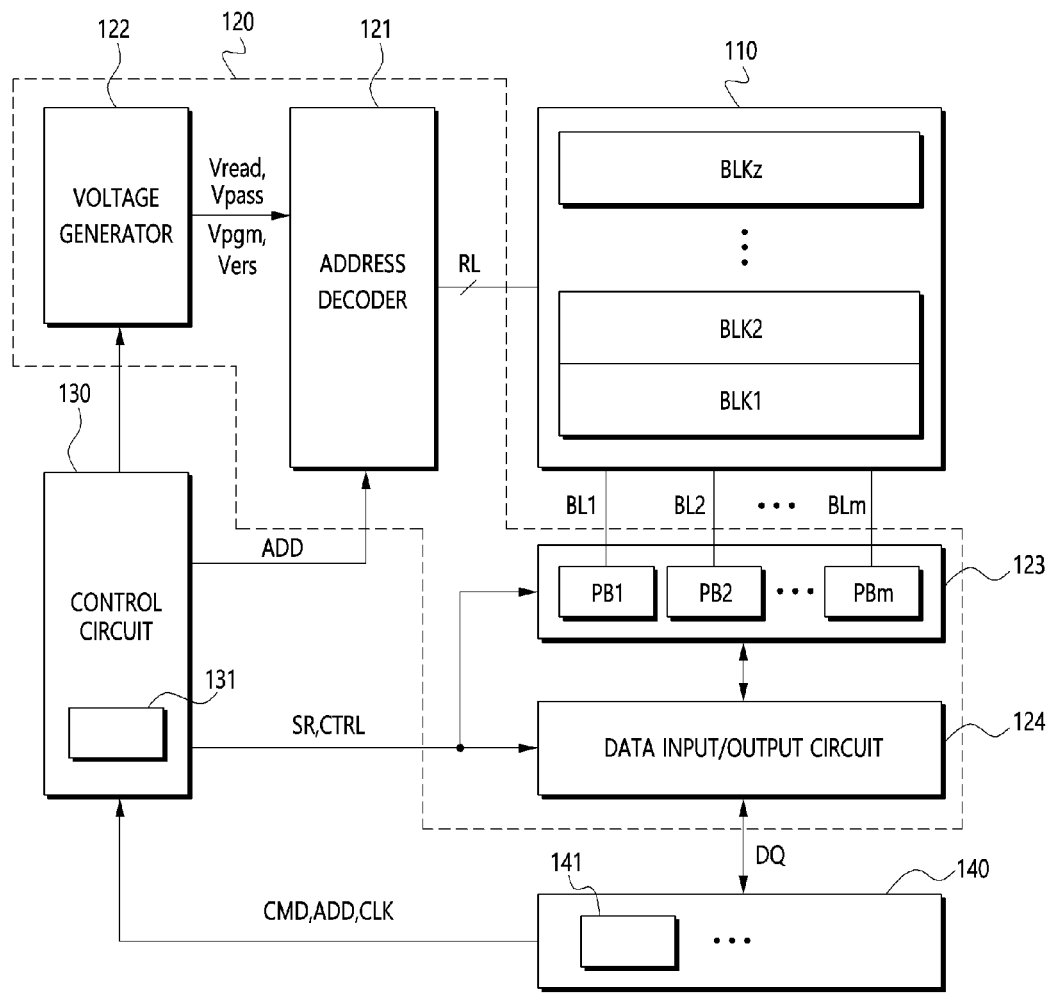
FIG. 2 is a diagram illustrating the configuration of a semiconductor apparatus 100 in accordance with an embodiment of the present disclosure.

FIG. 2 is a diagram illustrating the configuration of the semiconductor apparatus 100 in accordance with an embodiment of the present disclosure.

Referring to FIG. 2, the semiconductor apparatus 100 may include a memory cell array 110, a peripheral circuit 120, a control circuit 130, and an input/output pad unit 140. The peripheral circuit 120 may include an address decoder 121, a voltage generator 122, a read and write circuit 123, and a data input/output circuit 124.

The input/output pad unit 140 may receive the command CMD, addresses ADD, and the clock signal CLK, and include a plurality of pads 141 for inputting/outputting the data DQ.

The memory cell array 110 may be connected to the address decoder 121 through row lines RL and may be connected to the read and write circuit 123 through bit lines BL1 to BLm. The memory cell array 110 may include a plurality of memory blocks BLK1 to BLKz. The plurality of memory blocks BLK1 to BLKz may be connected to the address decoder 121 through the row lines RL. The plurality of memory blocks BLK1 to BLKz may be connected to the read and write circuit 123 through the bit lines BL1 to BLm. Each of the plurality of memory blocks BLK1 to BLKz may include a plurality of memory cells. The plurality of memory cells may be nonvolatile memory cells, respectively. Each of the memory blocks that is included in the memory cell array 110 may include a plurality of pages. Among the plurality of memory cells, memory cells that are connected to substantially the same word line may be defined as one page. The plurality of memory blocks BLK1 to BLKz may store normal data, that is, data that is transmitted and received by a normal read operation and a normal write operation.

Each of the memory cells of the semiconductor apparatus 100 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may drive the memory cell array 110 to perform a program operation, a read operation, and an erase operation.

The address decoder 121 may be connected to the memory cell array 110 through the row lines RL. The address decoder 121 may be configured to operate in response to the control of the control circuit 130. The address decoder 121 may receive the addresses ADD from the control circuit 130.

The address decoder 121 may decode a block address, among the addresses ADD. The address decoder 121 may select at least one memory block, among the memory blocks BLK1 to BLKz, according to the decoded block address. The address decoder 121 may be configured to decode a row address, among the received addresses ADD. The address decoder 121 may select at least one word line of the selected memory block by applying voltages that are received from the voltage generator 122 to at least one word line WL according to the decoded row address.

The address decoder 121 may perform a program operation by applying a program voltage Vpgm to the selected word line and applying a pass voltage Vpass having a lower level than the program voltage to unselected word lines.

The address decoder 121 may perform a read operation by applying a read voltage Vread to the selected word line and applying a pass voltage Vpass having a higher level than the read voltage Vread to unselected word lines.

An erase operation of the semiconductor apparatus 100 may be performed in units of memory blocks. The address decoder 121 may decode a block address and select one memory block according to the decoded block address. The address decoder 121 may perform an erase operation by applying a ground voltage to a word line input to the selected memory block and applying an erase voltage Vers to a bulk area where the selected memory block is formed.

The voltage generator 122 may generate various voltages that are required for the operation of the semiconductor apparatus 100. The voltage generator 122 may generate the read voltage Vread, the pass voltage Vpass, the program voltage Vpgm, the erase voltage Vers, and the like, and provide the generated voltages to the address decoder 121. For example, the voltage generator 122 may include a plurality of pumping capacitors and may generate a plurality of voltages by selectively activating the plurality of pumping capacitors under the control of the control circuit 130.

The read and write circuit 123 may include a plurality of page buffers, for example, a plurality of page buffers PB1 to PBm. The plurality of page buffers PB1 to PBm may be connected to the memory cell array 110 through the first to $m^{th}$ bit lines BL1 to BLm, respectively. The plurality of page buffers PB1 to PBm may operate in response to control signals CTRL that are received from the control circuit 130.

The plurality of page buffers PB1 to PBm may perform data communication with the data input/output circuit 124. The plurality of page buffers PB1 to PBm may receive data, which is to be stored, through the data input/output circuit 124 and data lines DL, and transfer the received data to the memory cell array 110, thereby performing a program operation. The read and write circuit 123 may read data from memory cells of a selected page through the bit lines BL and output the read data to the data input/output circuit 124, thereby performing a read operation. The read and write circuit 123 may perform an erase operation by floating the bit lines BL.

The data input/output circuit 124 may be connected between the plurality of page buffers PB1 to PBm and the input/output pad unit 140. The data input/output circuit 124 may perform a data input and output operation in response to the control signals CTRL that are received from the control circuit 130. During a read operation, the data input/output circuit 124 may output data, which is transferred from the plurality of memory blocks BLK1 to BLKz via the plurality of page buffers PB1 to PBm, to the controller 101 through the input/output pad unit 140. During a write operation, the data input/output circuit 124 may transfer data, which is input from the controller 101 through the input/output pad unit 140, to the plurality of page buffers PB1 to PBm. During a state information read operation, the data input/output circuit 124 may output state information, which is transferred from the control circuit 130, to the controller 101 through the input/output pad unit 140.

The control circuit 130 may be connected to the address decoder 121, the voltage generator 122, the read and write circuit 123, the data input/output circuit 124, and the input/output pad unit 140. The control circuit 130 may receive the command CMD, the addresses ADD, and the clock signal CLK through the input/output pad unit 140. The control circuit 130 may include a division circuit, and the division circuit may generate multi-phase clock signals ICLK, QCLK, ICLKB, and QCLKB by phase-separating and dividing the clock signal CLK. The multi-phase clock signals ICLK, QCLK, ICLKB, and QCLKB may have, for example, a frequency corresponding to ½ of the clock signal CLK. The control circuit 130 may generate the control signals CTRL for controlling the overall operations of the semiconductor apparatus 100 according to the command CMD. The control signals CTRL may include at least one of the multi-phase clock signals ICLK, QCLK, ICLKB, and QCLKB. The command CMD may include a read command, a write command, and a state information read command. The control circuit 130 may include a state information register 131. The control circuit 130 may read state information SR, which is stored in the state information register 131, in response to a state information read command provided from the controller 101, and output the read state information SR to the data input/output circuit 124. The state information SR that is output from the control circuit 130 may be provided to the controller 101 via the data input/output circuit 124 and the input/output pad unit 140. The state information SR may include a plurality of data bits. The plurality of data bits may each define whether the most recently input command has been normally performed, whether a previously input command has been normally performed, whether there is an operation currently in progress, whether there is an operation currently on standby, and the like, thereby allowing the controller 101 having received the state information SR to ascertain the operation state of the semiconductor apparatus 100.

Figure 3:
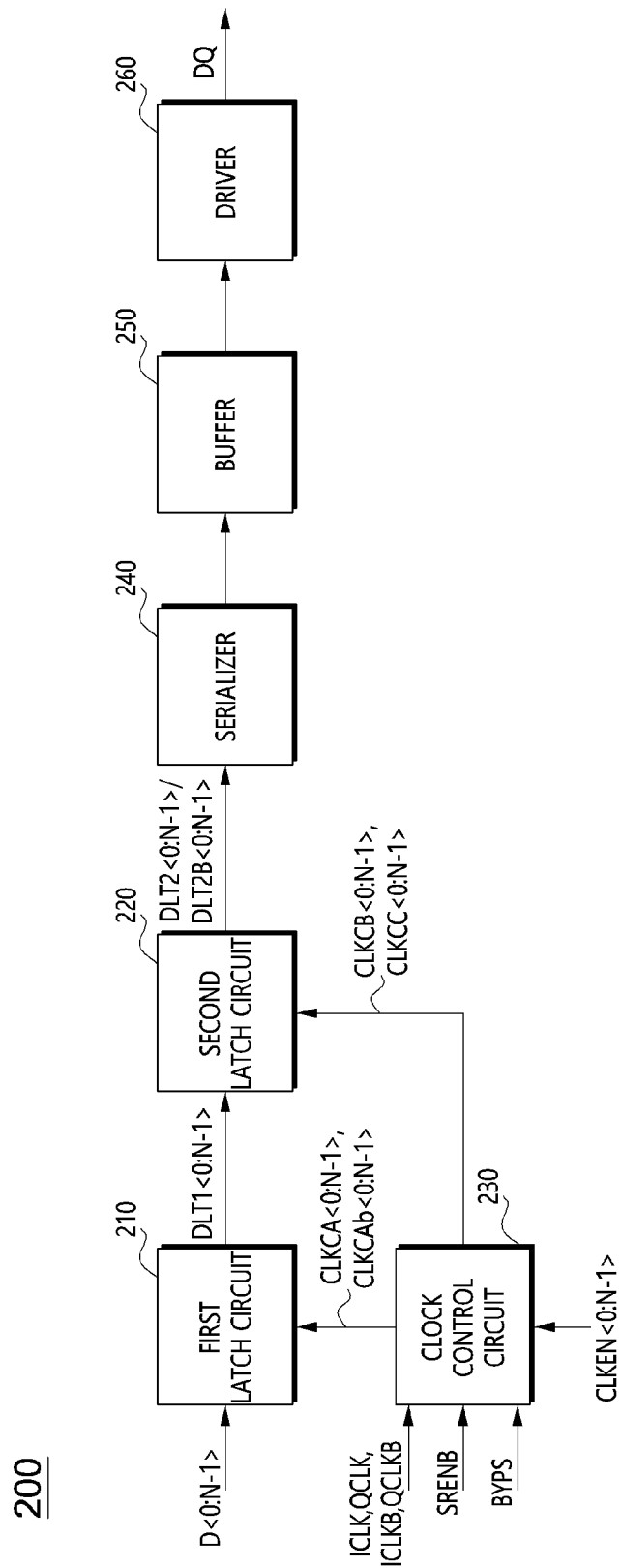
FIG. 3 is a diagram illustrating the configuration of a transmission circuit 200 in accordance with an embodiment of the present disclosure.

FIG. 3 is a diagram illustrating the configuration of a transmission circuit 200 in accordance with an embodiment of the present disclosure.

The transmission circuit 200 may be included in the data input/output circuit 124 in FIG. 2.

Referring to FIG. 3, the transmission circuit 200 may perform data transmission by latching and serializing data according to a predetermined timing and driving the pads of the input/output pad unit 140 according to the serialized signal.

The transmission circuit 200 may include a first latch circuit 210, a second latch circuit 220, a clock control circuit 230, a serializer 240, a buffer 250, and a driver 260.

The first latch circuit 210 may generate first output signals DLT1<0:N−1> by latching data D<0:N−1> according to first control clock signals CLKCA<0:N−1> and CLKCAb<0:N−1>. The first latch circuit 210 may be implemented as a level trigger circuit that causes a change in output according to the current level of a state variable, that is, an input signal and/or a clock signal.

The second latch circuit 220 may generate second output signals DLT2<0:N−1> and DLT2B<0:N−1> by using the first output signals DLT1<0:N−1> according to second control clock signals CLKCB<0:N−1> and third control clock signals CLKCC<0:N−1>. The second latch circuit 220 may be implemented as a level trigger circuit.

The clock control circuit 230 may generate the first control clock signals CLKCA<0:N−1> and CLKCAb<0:N−1>, the second control clock signals CLKCB<0:N−1>, and the third control clock signals CLKCC<0:N−1> by using the multi-phase clock signals ICLK, QCLK, ICLKB, and QCLKB according to a plurality of clock enable signals CLKEN<0:N−1>, a state information read enable signal SRENB, and a bypass signal BYPS. The state information read enable signal SRENB and the bypass signal BYPS may be generated according to a state information read command.

The serializer 240 may serialize and output the second output signals DLT2<0:N−1> and DLT2B<0:N−1>.

The buffer 250 may pre-drive and output the output of the serializer 240.

The driver 260 may drive the pads of the input/output pad unit 140 according to the output of the buffer 250.

Figure 4:
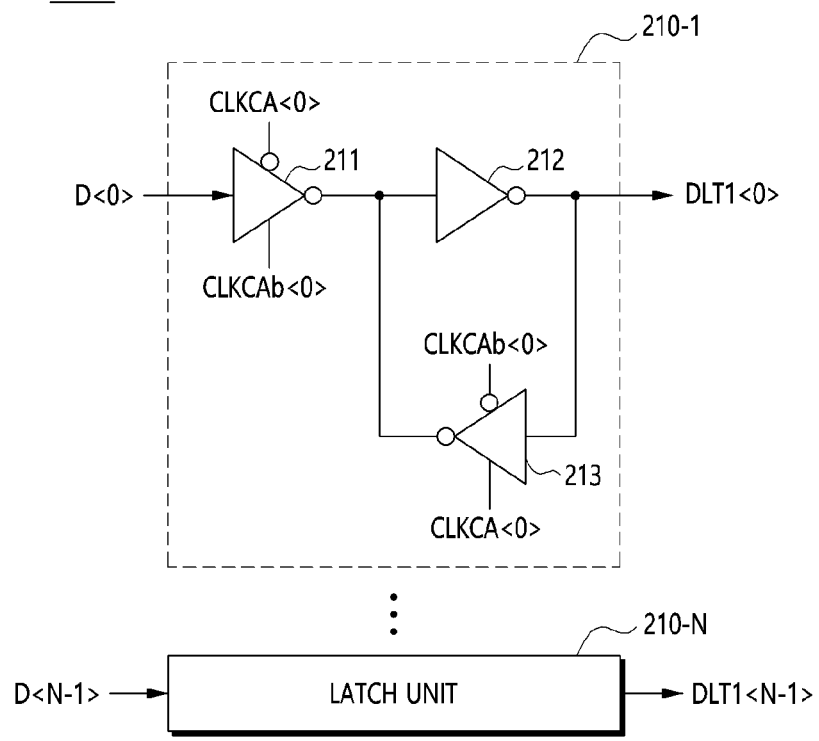
FIG. 4 is a diagram illustrating the configuration of a first latch circuit 210 in FIG. 3.

FIG. 4 is a diagram illustrating the configuration of the first latch circuit 210 in FIG. 3.

Referring to FIG. 4, the first latch circuit 210 may include a plurality of latch units 210-1 to 210-N for generating the first output signals DLT1<0:N−1> by latching the data D<0:N−1>, respectively. Since the plurality of latch units 210-1 to 210-N may be configured identically to one another, only the configuration of the latch unit 210-1 is illustrated and will be described.

The latch unit 210-1 may include first to third logic gates 211 to 213. The first logic gate 211 may invert the data D<0> according to the first control clock signals CLKCA<0> and CLKCAb<0> and output the inverted data. The first logic gate 211 may invert and output the data D<0> when the first control clock signals CLKCA<0> and CLKCAb<0> are at a low level and a high level, respectively. The second logic gate 212 may generate the first output signal DLT1<0> by inverting the output of the first logic gate 211. The third logic gate 213 may latch the output of the second logic gate 212 according to the first control clock signals CLKCA<0> and CLKCAb<0>. The third logic gate 213 may latch the output of the second logic gate 212 when the first control clock signals CLKCA<0> and CLKCAb<0> are at a high level and a low level, respectively.

The latch unit 210-1 may bypass the data D<0>, without latching the data D<0>, when the first control clock signals CLKCA<0> and CLKCAb<0> are substantially maintained at a low level and a high level, respectively.

Although not illustrated in FIG. 4, when signals of the first control clock signals CLKCA<0:N–1> and CLKCAb<0:N–1>, which correspond to the other latch units 210-2 to 210-N, are repeatedly transitioned, the other latch units 210-2 to 210-N may latch data bits, among the data D<0:N–1>, corresponding to the other latch units 210-2 to 210-N. When the signals of the first control clock signals CLKCA<0:N–1> and CLKCAb<0:N–1>, which correspond to the other latch units 210-2 to 210-N, are substantially maintained at a predetermined level, the other latch units 210-2 to 210-N may bypass data bits, among the data D<0:N–1>, corresponding to the other latch units 210-2 to 210-N, without latching the data bits. For example, when the first control clock signals CLKCA<0:N–1> and CLKCAb<0:N–1> are repeatedly transitioned, the latch unit 210-N may latch the data D<N–1>, and when the first control clock signals CLKCA<0:N–1> and CLKCAb<0:N–1> are substantially maintained at a predetermined level, the latch unit 210-N may bypass the data D<N–1> without latching the data D<N–1>. As described above, the first latch circuit 210 may be referred to as a level trigger circuit because it operates in a level trigger method of changing an output level according to the level of a clock signal instead of the transition of the clock signal.

Figure 5:
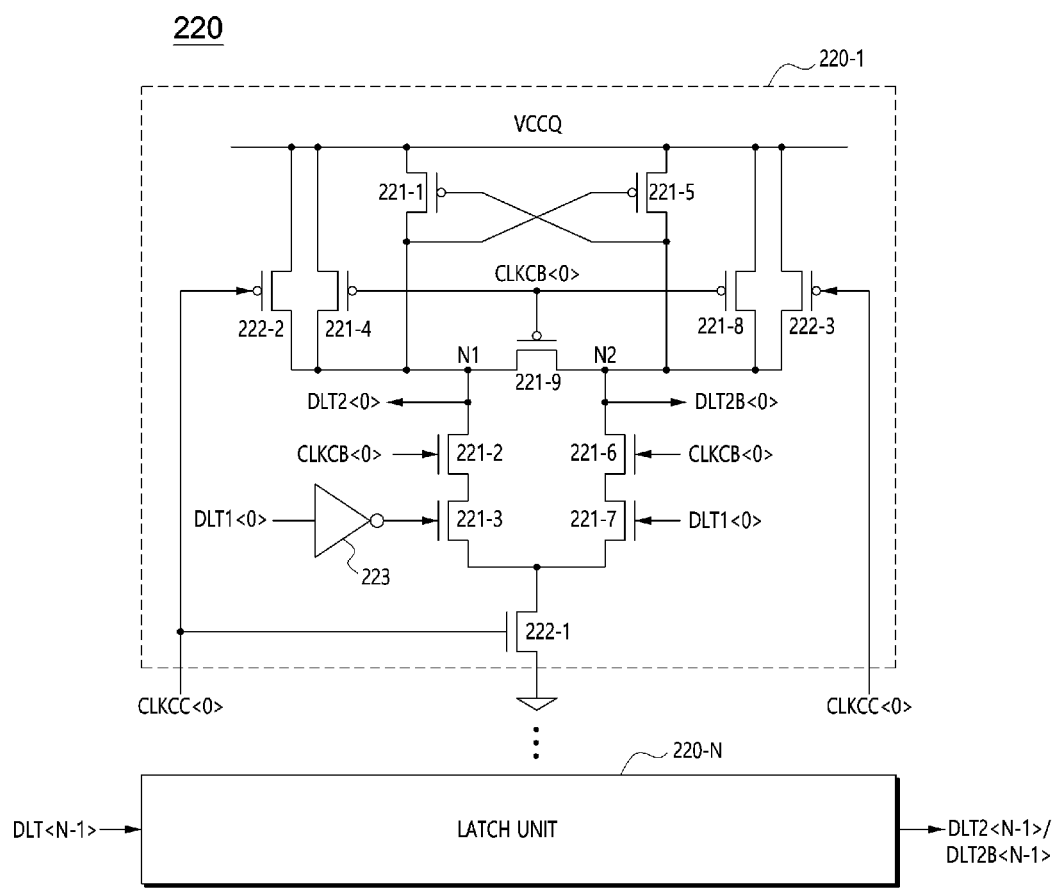
FIG. 5 is a diagram illustrating the configuration of a second latch circuit 220 in FIG. 3.

FIG. 5 is a diagram illustrating the configuration of the second latch circuit 220 in FIG. 3.

Referring to FIG. 5, the second latch circuit 220 may include a plurality of latch units 220-1 to 220-N for generating the second output signals DLT2<0:N–1> and DLT2B<0:N–1> by latching the first output signals DLT1<0:N–1>, respectively. Since the plurality of latch units 220-1 to 220-N may be configured identically to one another, only the configuration of the latch unit 220-1 is illustrated and will be described.

The latch unit 220-1 may include a plurality of transistors 221-1 to 221-9 and 222-1 to 222-3, and an inverter 223. In a first transistor 221-1, a first electrode may be connected to a second node N2, a second electrode may be connected to a power supply terminal VCCQ, and a third electrode may be connected to a first node N1. The first electrode, the second electrode, and the third electrode may each be one of a gate terminal, a source terminal, and a drain terminal. Hereinafter, in an embodiment of the present disclosure, it is assumed that the first electrode is a gate terminal, the second electrode is a source terminal, and the third electrode is a drain terminal. In a second transistor 221-2, a first electrode may receive the second control clock signal CLKCB<0>, and a third electrode may be connected to the first node N1. A voltage level of the third electrode of the second transistor 221-2 may be output as the second output signal DLT2<0>. The inverter 223 may invert and output the first output signal DLT1<0>. In a third transistor 221-3, a first electrode may receive the output of the inverter 223, and a third electrode may be connected to a second electrode of the second transistor 221-2. In a fourth transistor 221-4, a first electrode may receive the second control clock signal CLKCB<0>, a second electrode may be connected to the power supply terminal VCCQ, and a third electrode may be connected to the first node N1. In a fifth transistor 221-5, a first electrode may be connected to the first node N1, a second electrode may be connected to the power supply terminal VCCQ, and a third electrode may be connected to the second node N2. In a sixth transistor 221-6, a first electrode may receive the second control clock signal CLKCB<0> and a third electrode may be connected to the second node N2. A voltage level of the third electrode of the sixth transistor 221-6 may be output as the second output signal DLT2B<0>. In a seventh transistor 221-7, a first electrode may receive the first output signal DLT1<0> and a third electrode may be connected to a second electrode of the sixth transistor 221-6. In an eighth transistor 221-8, a first electrode may receive the second control clock signal CLKCB<0>, a second electrode may be connected to the power supply terminal VCCQ, and a third electrode may be connected to the second node N2. In a ninth transistor 221-9, a first electrode may receive the second control clock signal CLKCB<0>, a second electrode (or a third electrode) may be connected to the first node N1, and the third electrode (or the second electrode) may be connected to the second node N2. In a tenth transistor 222-1, a first electrode may receive the third control clock signal CLKCC<0>, a second electrode may be connected to a ground terminal, and a third electrode may be connected in common to a second electrode of the third transistor 221-3 and a second electrode of the seventh transistor 221-7. In an eleventh transistor 222-2, a first electrode may receive the third control clock signal CLKCC<0>, a second electrode may be connected to the power supply terminal VCCQ, and a third electrode may be connected to the first node N1. In a twelfth transistor 222-3, a first electrode may receive the third control clock signal CLKCC<0>, a second electrode may be connected to the power supply terminal VCCQ, and a third electrode may be connected to the second node N2.

The latch unit 220-1 may precharge the first node N1 and the second node N2 to the level of the power supply terminal VCCQ when the second control clock signal CLKCB<0> is at a low level, and change the levels of the second output signals DLT2<0> and DLT2B<0> according to the level of the first output signal DLT1<0> during the high level period of the second control clock signal CLKCB<0> and the third control clock signal CLKCC<0>. The other latch units 220-2 to 220-N may operate in substantially the same manner as the latch unit 220-1. For example, the latch unit 220-N may precharge the first node N1 and the second node N2 to the level of the power supply terminal VCCQ when the second control clock signal CLKCB<N–1> is at a low level and may change the levels of the second output signals DLT2<N–1> and DLT2B<N–1> according to the level of the first output signal DLT1<N–1> during the high level period the second control clock signal CLKCB<N–1> and the third control clock signal CLKCC<N–1>. As described above, the second latch circuit 220 may be referred to as a level trigger circuit because it operates in a level trigger method of changing an output level according to the level of a clock signal instead of the transition of the clock signal.

Figure 6:
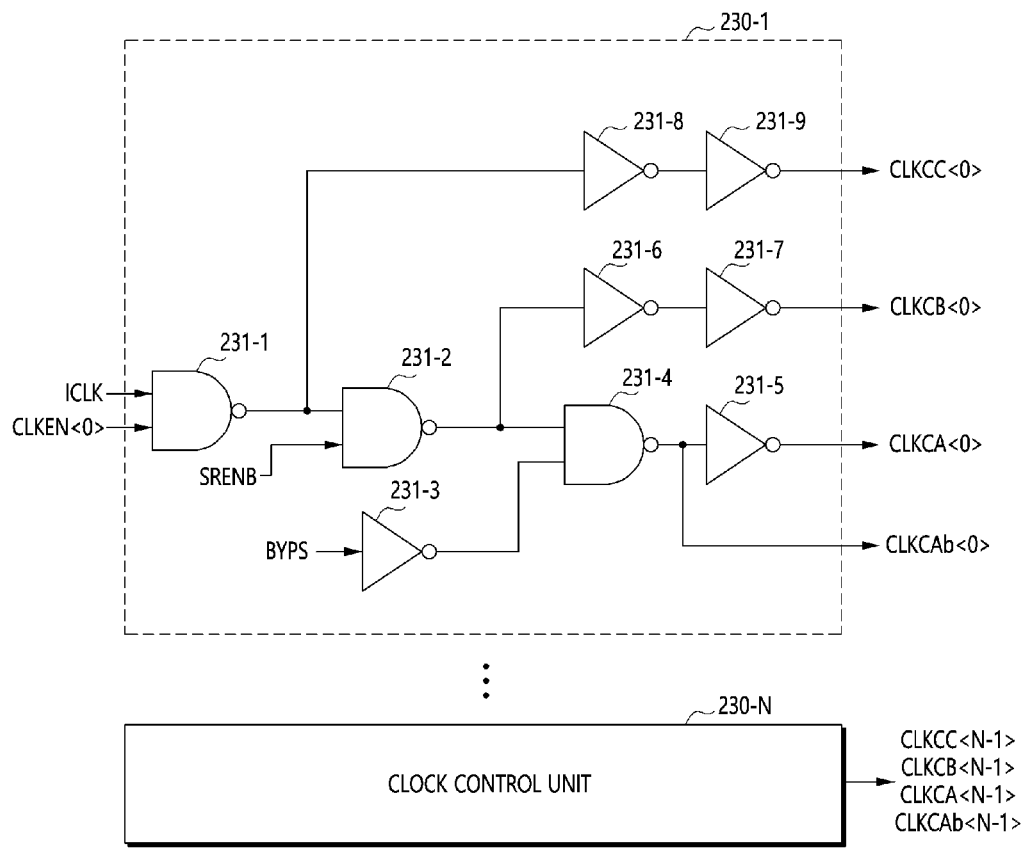
FIG. 6 is a diagram illustrating the configuration of a clock control circuit 230 in FIG. 3.

FIG. 6 is a diagram illustrating the configuration of the clock control circuit 230 in FIG. 3.

Referring to FIG. 6, the clock control circuit 230 may include a plurality of clock control units 230-1 to 230-N for generating the first control clock signals CLKCA<0:N–1> and CLKCAb<0:N–1>, the second control clock signals CLKCB<0:N–1>, and the third control clock signals CLKCC<0:N–1> by using the multi-phase clock signals ICLK, QCLK, ICLKB, and QCLKB according to the plurality of clock enable signals CLKEN<0:N–1>, the state information read enable signal SRENB, and the bypass signal BYPS. Since the plurality of clock control units 230-1 to 230-N may be configured identically to one another, only the configuration of the clock control unit 230-1 is illustrated and will be described.

The plurality of clock enable signals CLKEN<0:N−1> may be signals for controlling the activation of the multi-phase clock signals ICLK, QCLK, ICLKB, and QCLKB and may correspond to the multi-phase clock signals ICLK, QCLK, ICLKB, and QCLKB, respectively. For example, when N is 4, CLKEN<0> may correspond to ICLK, CLKEN<1> may correspond to QCLK, CLKEN<2> may correspond to ICLKB, and CLKEN<3> may correspond to QCLKB. The state information read enable signal SRENB is a signal generated according to a state information read operation and may be generated to have a low level during the state information read operation. The bypass signal BYPS may be a signal that is generated according to the state information read operation and may be generated to have a high level during the state information read operation.

The clock control unit 230-1 may include a plurality of logic gates 231-1 to 231-9. A first logic gate 231-1 may perform a NAND operation on any one (for example, ICLK) of the multi-phase clock signals ICLK, QCLK, ICLKB, and QCLKB and the clock enable signal CLKEN<0> and output the NANDed signal. A second logic gate 231-2 may perform a NAND operation on the state information read enable signal SRENB and the output of the first logic gate 231-1, and output the NANDed signal. A third logic gate 231-3 may invert and output the bypass signal BYPS. A fourth logic gate 231-4 may perform a NAND operation on the output of the second logic gate 231-2 and the output of the third logic gate 231-3 to generate the first control clock signal CLKCAb<0>. A fifth logic gate 231-5 may invert the output of the fourth logic gate 231-4 to generate the first control clock signal CLKCA<0>. A sixth logic gate 231-6 and a seventh logic gate 231-7 may buffer the output of the second logic gate 231-2 to generate the second control clock signal CLKCB<0>. An eighth logic gate 231-8 and a ninth logic gate 231-9 may buffer the output of the first logic gate 231-1 to generate the third control clock signal CLKCC<0>.

During the normal read operation of the semiconductor apparatus 100, a plurality of parallel data need to be latched based on the multi-phase clock signals ICLK, QCLK, ICLKB, and QCLKB and to be output to the outside of the semiconductor apparatus 100. During the normal read operation, the state information read enable signal SRENB is at a high level and the bypass signal BYPS is at a low level. Accordingly, the clock control circuit 230 may cause the first control clock signals CLKCA<0:N−1> and CLKCAb<0:N−1>, the second control clock signals CLKCB<0:N−1>, and the third control clock signals CLKCC<0:N−1> to be repeatedly transitioned in response to the multi-phase clock signals ICLK, QCLK, ICLKB, and QCLKB. Accordingly, the transmission circuit 200 may latch and serialize parallel data D<0:N−1> according to the timing based on the multi-phase clock signals ICLK, QCLK, ICLKB, and QCLKB and drive the pads of the input/output pad unit 140 according to the serialized signal, thereby performing data transmission.

Meanwhile, the state information read operation of the semiconductor apparatus 100 may consist of only an operation of sequentially outputting serial state information, regardless of the multi-phase clock signals ICLK, QCLK, ICLKB, and QCLKB. During the state information read operation, the multi-phase clock signals ICLK, QCLK, ICLKB, and QCLKB may be fixed to a predetermined level (for example, a high level), and the state information read enable signal SRENB may be at a low level, and the bypass signal BYPS may be at a high level. Accordingly, the clock control circuit 230 may substantially maintain the first control clock signals CLKCA<0:N−1> at a low level, substantially maintain the first control clock signals CLKCAb<0:N−1> at a high level, and substantially maintain the second control clock signals CLKCB<0:N−1> and the third control clock signals CLKCC<0:N−1> at a high level. Accordingly, the first latch circuit 210 may bypass the parallel data D<0:N−1> without a latch operation, and the second latch circuit 220 may also generate the second output signals DLT2<0:N−1> and DLT2B<0:N−1> according to the levels of the first output signals DLT1<0:N−1> without a latch operation. Since the multi-phase clock signals ICLK, QCLK, ICLKB, and QCLKB are fixed to a high level, the second output signals DLT2<0:N−1> and DLT2B<0:N−1> are driven to the input/output pad unit 140 via the serializer 240, the buffer 250, and the driver 260, so that state information transmission may be performed.

Figure 7:
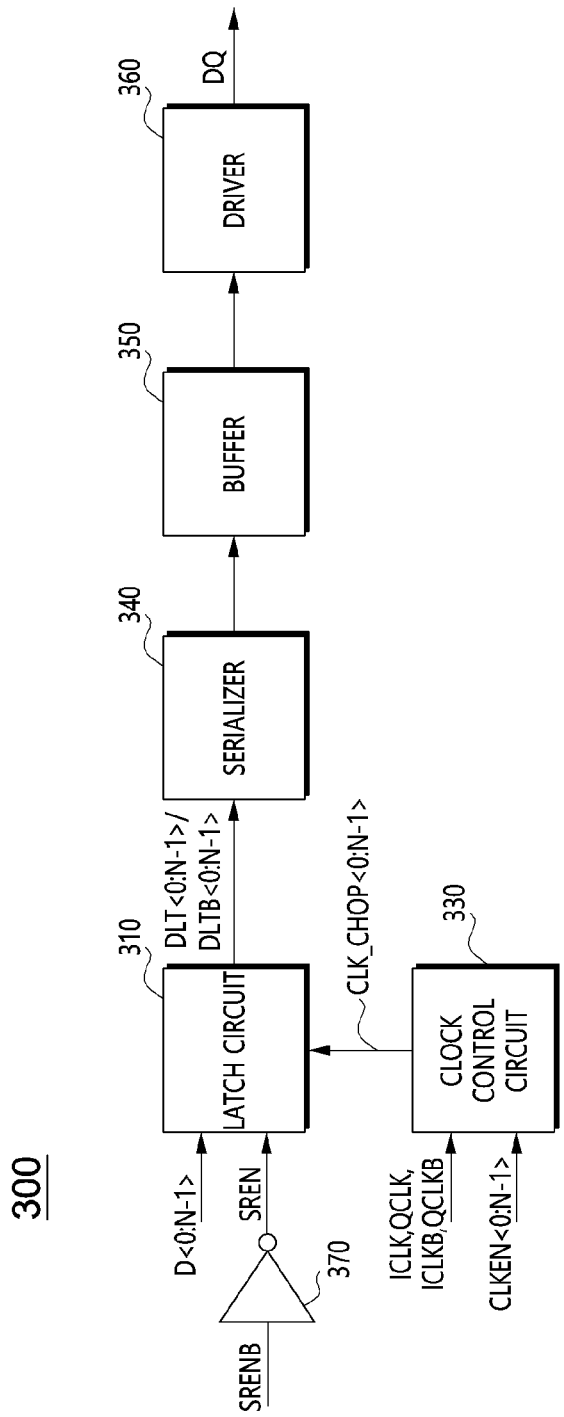
FIG. 7 is a diagram illustrating the configuration of a transmission circuit 300 in accordance with another embodiment of the present disclosure.

FIG. 7 is a diagram illustrating the configuration of a transmission circuit 300 in accordance with another embodiment of the present disclosure.

The transmission circuit 300 may be included in the data input/output circuit 124 in FIG. 2.

Referring to FIG. 7, the transmission circuit 300 may perform data transmission by latching and serializing data according to a predetermined timing and driving the pads of the input/output pad unit 140 according to the serialized signal.

The transmission circuit 300 may include a latch circuit 310, a clock control circuit 330, a serializer 340, a buffer 350, and a driver 360. The transmission circuit 300 may further include a logic gate 370 for generating an inverted state information read enable signal SREN by inverting a state information read enable signal SRENB.

The latch circuit 310 may generate output signals DLT<0:N−1> and DLTB<0:N−1> by latching data D<0:N−1> according to the state information read enable signal SRENB and control clock signals CLK_CHOP<0:N−1>. The latch circuit 310 may be configured to support both an edge trigger operation and the aforementioned level trigger operation. Switching to one of the level trigger circuit operation and the edge trigger circuit operation may be possible according to the state information read enable signal SRENB. The edge trigger method may change an output level according to an input level in response to a state variable, that is, a rising edge or a falling edge of a clock signal, and may enable stable signal processing at a higher operation frequency than that in the level trigger method.

The clock control circuit 330 may generate the control clock signals CLK_CHOP<0:N−1> according to a plurality of clock enable signals CLKEN<0:N−1> and multi-phase clock signals ICLK, QCLK, ICLKB, and QCLKB.

The serializer 340 may serialize and output the output signals DLT<0:N−1> and DLTB<0:N−1>.

The buffer 350 may pre-drive and output the output of the serializer 340.

The driver 360 may drive the pads of the input/output pad unit 140 according to the output of the buffer 350.

Figure 8:
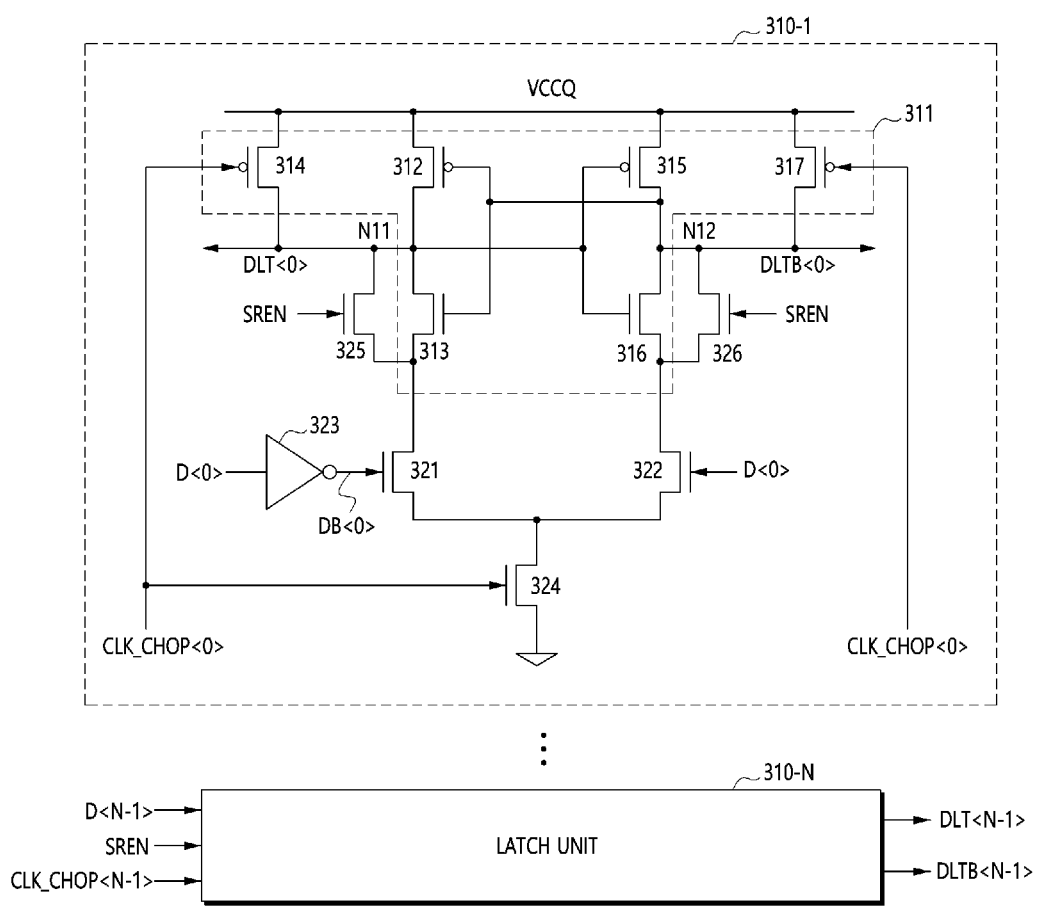
FIG. 8 is a diagram illustrating the configuration of a latch circuit 310 in FIG. 7.

FIG. 8 is a diagram illustrating the configuration of the latch circuit 310 in FIG. 7.

The latch circuit 310 may be configured to generate the output signals DLT<0:N−1> and DLTB<0:N−1> by detecting the levels of the data D<0: N−1> in response to the transition of the control clock signals CLK_CHOP<0:N−1> during a normal read operation, and to generate the output signals DLT<0:N−1> and DLTB<0:N−1> by detecting the levels of the data D<0: N−1> in a state, in which the levels of the control clock signals CLK_CHOP<0:N−1> are fixed to a set level, during a state information read operation.

The latch circuit 310 may include a first detection unit configured to generate the output signals DLT<0:N−1> and DLTB<0:N−1> by detecting the levels of the data D<0:N−1> in response to the transition of the control clock signals CLK_CHOP<0:N−1> during the normal read operation, and a second detection unit configured to generate the output signals DLT<0:N−1> and DLTB<0:N−1> by detecting the levels of the data D<0: N−1> regardless of the transition of the control clock signals CLK_CHOP<0:N−1> during the state information read operation.

Referring to FIG. 8, the latch circuit 310 may include a plurality of latch units 310-1 to 310-N. Since the plurality of latch units 310-1 to 310-N may be configured identically to one another, only the configuration of the latch unit 310-1 is illustrated and will be described.

The latch unit 310-1 may include differential input terminals 321 to 323, a current sink 324, a cross-coupled latch 311, and switching sections 325 and 326.

The differential input terminals 321 to 323 may include a first transistor 321, a second transistor 322, and a logic gate 323. The logic gate 323 may invert the data D<0> to generate inverted DB<0>.

The current sink 324 may be configured as a transistor and may connect or disconnect a current path of the latch unit 310-1 by connecting the differential input terminals 321 to 323 and the ground terminal according to the control clock signal CLK_CHOP<0>.

The cross-coupled latch 311 may generate the output signals DLT<0> and DLTB<0> by detecting the levels of the differential input terminals 321 to 323 in response to the transition of the control clock signal CLK_CHOP<0> and may output the output signals DLT<0> and DLTB<0> through differential output terminals N11 and N12. The cross-coupled latch 311 may include a plurality of transistors 312 to 317. The differential output terminals N11 and N12 may include a first node N11 and a second node N12. In a first transistor 312, a first electrode may be connected to the second node N12, a second electrode may be connected to the power supply terminal VCCQ, and a third electrode may be connected to the first node N11. In a second transistor 313, a first electrode may be connected to the second node N12 and the first electrode of the first transistor 312, a third electrode may be connected to the first node N11, and a second electrode may be connected to the first transistor 321 of the differential input terminals 321 to 323. In a third transistor 314, a first electrode may receive the control clock signal CLK_CHOP<0>, a second electrode may be connected to the power supply terminal VCCQ, and a third electrode may be connected to the first node N11. In a fourth transistor 315, a first electrode may be connected to the first node N11, a second electrode may be connected to the power supply terminal VCCQ, and a third electrode may be connected to the second node N12 and the first electrode of the first transistor 312. In a fifth transistor 316, a first electrode may be connected to the first node N11 and the first electrode of the fourth transistor 315, a third electrode may be connected to the second node N12, and a second electrode may be connected to the second transistor 322 of the differential input terminals 321 to 323. In a sixth transistor 317, a first electrode may receive the control clock signal CLK_CHOP<0>, a second electrode may be connected to the power supply terminal VCCQ, and a third electrode may be connected to the second node N12. The third transistor 314 may operate as the first detection unit and the sixth transistor 317 may operate as the second detection unit.

The switching sections 325 and 326 may be connected between the differential input terminals 321 to 323 and the differential output terminals N11 and N12 and may be configured to change the levels of the differential output terminals N11 and N12 according to changes in the levels of the differential input terminals 321 to 323, regardless of the transition of the control clock signal CLK_CHOP<0>, when the inverted state information read enable signal SREN is at a high level. The switching sections 325 and 326 may include a first switch 325 that is connected between the first node N11 and the first transistor 321 of the differential input terminals 321 to 323 and a second switch 326 that is connected between the second node N12 and the second transistor 322 of the differential input terminals 321 to 323.

The other latch units 310-2 to 310-N may operate in substantially the same manner as the latch unit 310-1. For example, when the inverted state information read enable signal SREN is at a low level, the latch unit 310-N may generate the output signals DLT<N−1> and DLTB<N−1> by latching the levels of the differential input terminals 321 to 323 in response to the transition of the control clock signal CLK_CHOP<N−1>, and output the output signals DLT<N−1> and DLTB<N−1> through the differential output terminals N11 and N12. When the inverted state information read enable signal SREN is at a high level, the latch unit 310-N may change the levels of the differential output terminals N11 and N12 according to changes in the levels of the differential input terminals 321 to 323 regardless of the transition of the control clock signals CLK_CHOP<0:N−1>.

Figure 9:
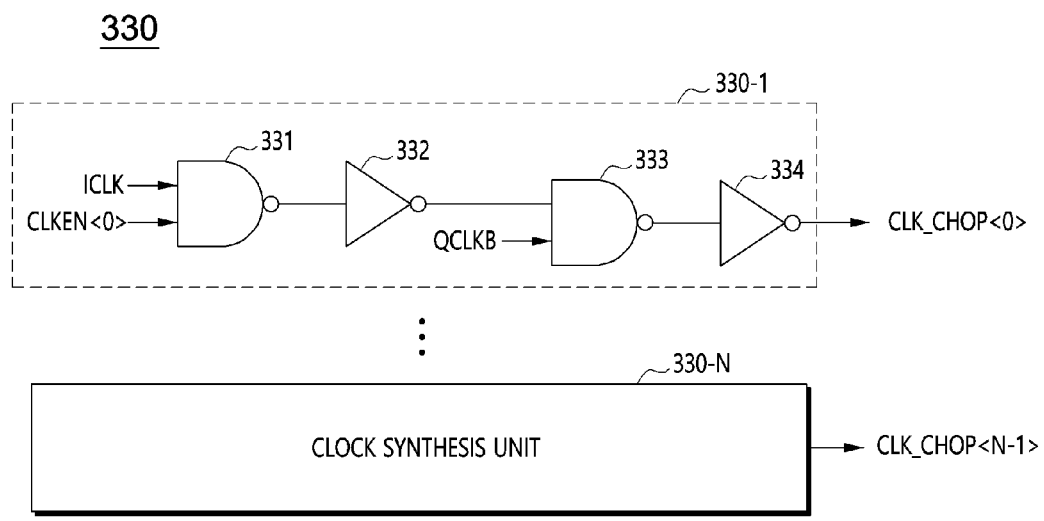
FIG. 9 is a diagram illustrating the configuration of a clock control circuit 330 in FIG. 7.
Figure 10:
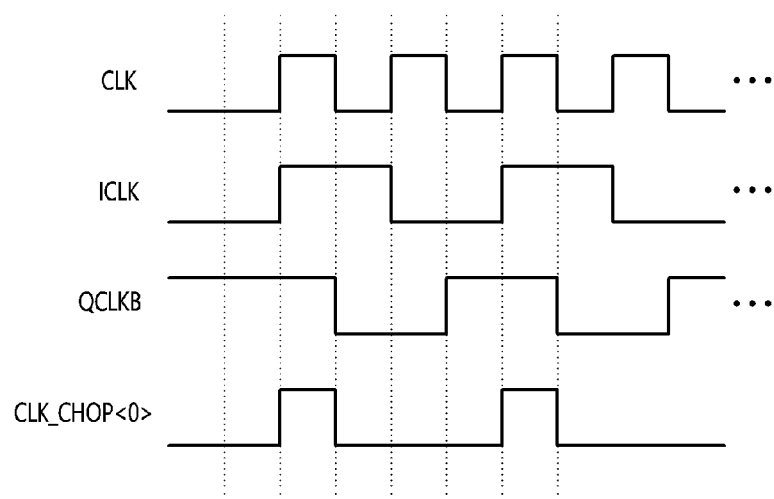
FIG. 10 is an operation timing diagram of the clock control circuit 330 in FIG. 9.

FIG. 9 is a diagram illustrating the configuration of the clock control circuit 330 in FIG. 7, and FIG. 10 is an operation timing diagram of the clock control circuit 330 in FIG. 9.

Referring to FIG. 9, the clock control circuit 330 may include a plurality of clock synthesis units 330-1 to 330-N for generating the control clock signals CLK_CHOP<0:N−1> by selectively combining the multi-phase clock signals ICLK, QCLK, ICLKB, and QCLKB according to the plurality of clock enable signals CLKEN<0:N−1>. Since the plurality of clock synthesis units 330-1 to 330-N may be configured identically to one another, only the configuration of the clock synthesis unit 330-1 is illustrated and will be described.

The clock synthesis unit 330-1 may include a plurality of logic gates 331 to 334. A first logic gate 331 and a second logic gate 332 may perform an AND operation on any one (for example, ICLK) of the multi-phase clock signals ICLK, QCLK, ICLKB, and QCLKB and the clock enable signal CLKEN<0> and output the ANDed signal. A third logic gate 333 and a fourth logic gate 334 may perform an AND operation on the output of the second logic gate 332 and another one (for example, QCLKB) of the multi-phase clock signals ICLK, QCLK, ICLKB, and QCLKB, and output the result as the control clock signal CLK_CHOP<0>.

The other clock synthesis units 330-2 to 330-N may operate in substantially the same manner as the clock synthesis unit 330-1. For example, the clock synthesis unit 330-N may generate the control clock signal CLK_CHOP<N−1> by synthesizing two signals, among the multi-phase clock signals ICLK, QCLK, ICLKB, and QCLKB, corresponding to the clock synthesis unit 330-N.

Referring to FIG. 10, the clock synthesis unit 330-1 may generate the control clock signal CLK_CHOP<0> by synthesizing ICLK and QCLKB, which are clock signals having a predetermined phase difference, for example, in which there is a difference of ¼ cycle between a rising edge and a falling edge, such as the multi-phase clock signals ICLK, QCLK, ICLKB, and QCLKB. The control clock signal CLK_CHOP<0> may have substantially the same frequency as that of an external clock signal CLK. The latch circuit 310 may be controlled only by the control clock signal CLK_CHOP<0> having substantially the same frequency as that of the external clock signal CLK, which makes it possible to easily secure a high-speed operation and an operation timing margin of the transmission circuit 300.

During the normal read operation of the semiconductor apparatus 100, a plurality of parallel data need to be latched based on the multi-phase clock signals ICLK, QCLK, ICLKB, and QCLKB and to be output to the outside of the semiconductor apparatus 100. During the normal read operation, the multi-phase clock signals ICLK, QCLK, ICLKB, and QCLKB may be repeatedly transitioned in response to the external clock signal CLK, and the inverted state information read enable signal SREN may be at a low level. Accordingly, the latch circuit 310 may generate the output signals DLT<0:N−1> and DLTB<0:N−1> by detecting the levels of the data D<0:N−1> in response to the transition of the control clock signals CLK_CHOP<0:N−1>, that is, a rising edge and a falling edge. Accordingly, the transmission circuit 300 may latch and serialize the parallel data D<0: N−1> according to the timing based on the multi-phase clock signals ICLK, QCLK, ICLKB, and QCLKB and drive the pads of the input/output pad unit 140 according to the serialized signal, thereby performing data transmission.

Meanwhile, the state information read operation of the semiconductor apparatus 100 may consist of only an operation of sequentially outputting serial state information regardless of the multi-phase clock signals ICLK, QCLK, ICLKB, and QCLKB. During the state information read operation, the multi-phase clock signals ICLK, QCLK, ICLKB, and QCLKB may be fixed to a predetermined level (for example, a high level), and the inverted state information read enable signal SREN may be at a high level. Since the multi-phase clock signals ICLK, QCLK, ICLKB, and QCLKB may be fixed to a high level, the clock control circuit 330 may substantially maintain the control clock signals CLK_CHOP<0:N−1> at a high level. Accordingly, in the latch circuit 310, the switching sections 325 and 326 may change the levels of the differential output terminals N11 and N12 according to changes in the levels of the differential input terminals 321 to 323 regardless of the transition of the control clock signals CLK_CHOP<0:N−1>, thereby generating the output signals DLT<0:N−1> and DLTB<0:N−1>. Accordingly, the transmission circuit 300 may transmit state information by driving the output signals DLT<0:N−1> and DLTB<0:N−1> to the input/output pad unit 140 via the serializer 340, the buffer 350, and the driver 360.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all modifications or modified forms derived from the equivalent concept thereof are included in the scope of the present disclosure.

What is claimed is:
1. A latch circuit comprising:
   a first detection unit configured to generate an output signal by detecting a level of an input terminal in response to a transition of a control clock signal during a normal read operation; and
   a second detection unit configured to generate the output signal by detecting the level of the input terminal in response to the control clock signal during a state information read operation,
   wherein the control clock signal transits repeatedly during the normal read operation, and the control clock signal is fixed to a first logic level during the state information read operation.

2. The latch circuit according to claim 1, wherein the first detection unit is configured to generate the output signal by detecting a level of data, which is input through the input terminal, in response to a rising edge or a falling edge that occurs when the control clock signal transitions.

3. The latch circuit according to claim 1, wherein the state information includes a plurality of data bits for defining at least one of whether a recently input command has been normally performed, whether a previously input command has been normally performed, whether there is an operation currently in progress, and whether there is an operation currently on standby.

4. The latch circuit according to claim 3, wherein the first detection unit is configured to operate as an edge trigger circuit, and
   wherein the second detection unit is configured to operate as a level trigger circuit.

5. A latch circuit comprising:
   a cross-coupled latch configured to latch a level of an input terminal in response to a transition of a control clock signal and output latched data through an output terminal; and
   a switching section, connected between the output terminal and the input terminal, configured to output state information, which is input through the input terminal, through the output terminal in response to a state information read signal regardless of a transition of the control clock signal.

6. The latch circuit according to claim 5, wherein the cross-coupled latch is configured to detect the level of the input terminal in response to a rising edge or a falling edge that occurs when the control clock signal transitions.

7. The latch circuit according to claim 5, wherein the state information includes a plurality of data bits for defining at least one of whether a recently input command has been normally performed, whether a previously input command has been normally performed, whether there is an operation currently in progress, and whether there is an operation currently on standby.

8. The latch circuit according to claim 5, wherein the latch circuit is configured to operate as an edge trigger circuit during a normal read operation and is configured to operate as a level trigger circuit during a state information read operation.

9. A transmission circuit comprising:
   a latch circuit configured to:
      generate output signals by detecting levels of each data, which are input through a plurality of differential input terminals, according to each of a rising edge and a falling edge of control clock signals during a normal read operation, and
      generate the output signals by detecting a level of state information, which is input through the plurality of differential input terminals, in response to the control clock signals during a state information read operation; and a serializer configured to serialize and output the output signals, wherein the control clock signals transits repeatedly during the normal read operation, and the control clock signals are fixed to a first logic level during the state information read operation.

10. The transmission circuit according to claim 9, further comprising:

a driver configured to drive pads of an input/output pad unit according to the output of the serializer.

11. The transmission circuit according to claim 9, further comprising:

a division circuit configured to generate multi-phase clock signals by dividing an external clock signal; and a clock control circuit configured to generate the control clock signals having a frequency that is equal to a frequency of the external clock signal by selectively combining the multi-phase clock signals according to a plurality of clock enable signals.

12. The transmission circuit according to claim 9, wherein the latch circuit includes a plurality of latch units, and wherein at least one of the plurality of latch units comprises:

a cross-coupled latch configured to latch a level of a first differential input terminal, among the plurality of differential input terminals, in response to a transition of a first control clock signal, among the control clock signals, and configured to output latched data through a first output terminal; and a switching section, connected between the first differential input terminal and the first output terminal, configured to output state information, which is input through the first differential input terminal, through the first output terminal in response to a state information read signal, regardless of the transition of the first control clock signal.

13. The transmission circuit according to claim 12, wherein the cross-coupled latch is configured to detect the level of the first differential input terminal in response to a rising edge or a falling edge that occurs when the first control clock signal transitions.

14. The transmission circuit according to claim 9, wherein the state information includes a plurality of data bits for defining at least one of whether a recently input command has been normally performed, whether a previously input command has been normally performed, whether there is an operation currently in progress, and whether there is an operation currently on standby.

15. The transmission circuit according to claim 9, wherein the latch circuit is configured to operate as an edge trigger circuit during the normal read operation and is configured to operate as a level trigger circuit during the state information read operation.

16. A semiconductor apparatus comprising:

a memory cell array configured to store normal data;

a control circuit configured to generate control signals including multi-phase clock signals in response to an external clock signal and configured to output internally stored state information in response to a state information read command;

an input/output pad unit; and a transmission circuit configured to:

generate output signals by detecting levels of each of the normal data, which are input through a plurality of differential input terminals, according to each of a rising edge and a falling edge of control clock signals and to output the output signals to an external device through the input/output pad unit during a normal read operation, and generate the output signals by detecting a level of state information, which is input through the plurality of differential input terminals, in response to the control clock signals and to output the output signals to an external device through the input/output pad unit during a state information read operation, wherein the control clock signals transits repeatedly during the normal read operation, and the control clock signals are fixed to a first logic level during the state information read operation.

17. The semiconductor apparatus according to claim 16, wherein the control circuit comprises:

a division circuit configured to generate the multi-phase clock signals by phase-separating and dividing the external clock signal.

18. The semiconductor apparatus according to claim 16, wherein the transmission circuit comprises:

a latch circuit configured to generate the output signals by detecting the levels of the input data according to the transition of the control clock signals during the normal read operation and configured to generate the output signals by detecting the level of the input state information, regardless of the transition of the control clock signals, during the state information read operation; and a clock control circuit configured to generate the control clock signals having a frequency that is equal to a frequency of the external clock signal by selectively combining the multi-phase clock signals according to a plurality of clock enable signals.

19. The semiconductor apparatus according to claim 18, wherein the latch circuit includes a plurality of latch units, and wherein at least one of the plurality of latch units comprises:

a cross-coupled latch configured to latch a level of a first differential input terminal in response to a transition of a first control clock signal, among the control clock signals, and to output a latched signal through a first output terminal; and a switching section connected between the first differential input terminal and the first output terminal, and configured to output a signal, which is input through the first differential input terminal, through the first output terminal in response to a state information read signal regardless of the transition of the first control clock signal.

20. The semiconductor apparatus according to claim 16, wherein the state information includes a plurality of data bits for defining at least one of whether a recently input command has been normally performed, whether a previously input command has been normally performed, whether there is an operation currently in progress, and whether there is an operation currently on standby.

* * * * *